United States Patent
Ezaki et al.

(10) Patent No.: US 7,068,696 B2
(45) Date of Patent: Jun. 27, 2006

(54) VERTICAL-CAVITY SURFACE EMITTING LASER DIODE AND ITS MANUFACTURING METHOD

(75) Inventors: Mizunori Ezaki, Kanagawa-ken (JP); Michihiko Nishigaki, Kanagawa-ken (JP); Keiji Takaoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 10/720,515

(22) Filed: Nov. 25, 2003

(65) Prior Publication Data

US 2004/0165636 A1 Aug. 26, 2004

(30) Foreign Application Priority Data

Nov. 26, 2002 (JP) .............................. 2002-342085

(51) Int. Cl.
*H01S 5/00* (2006.01)
(52) U.S. Cl. ........................................... 372/46; 372/43
(58) Field of Classification Search ................... 372/46
See application file for complete search history.

(56) References Cited

U.S. PATENT DOCUMENTS

| 5,493,577 A | 2/1996 | Choquette et al. |
| 5,881,085 A * | 3/1999 | Jewell ................... 372/46.013 |
| 6,678,307 B1 | 1/2004 | Ezaki et al. |
| 2001/0011730 A1 | 8/2001 | Saeki |
| 2003/0063649 A1* | 4/2003 | Ezaki et al. ................... 372/96 |
| 2005/0190812 A1* | 9/2005 | Johnson et al. ................ 372/99 |

FOREIGN PATENT DOCUMENTS

| JP | 9-266350 | 10/1997 |
| JP | 11-112084 | 4/1999 |

* cited by examiner

*Primary Examiner*—Minsun Oh Harvey
*Assistant Examiner*—Dung (Michael) T. Nguyen
(74) *Attorney, Agent, or Firm*—Oblon, Spivak, McClelland, Maier & Neustadt, P.C.

(57) ABSTRACT

A vertical-cavity surface emitting laser diode comprises: a first and a second reflectors; an active layer provided between the first and the second reflectors; and an oxidizee layer having a non-oxidized part and an oxidized part provided around the non-oxidized part. An electric current is injected into the non-oxidized part. The oxidizee layer has a proton-containing part including proton at least at a position substantially enclosing the non-oxidized part.

20 Claims, 12 Drawing Sheets

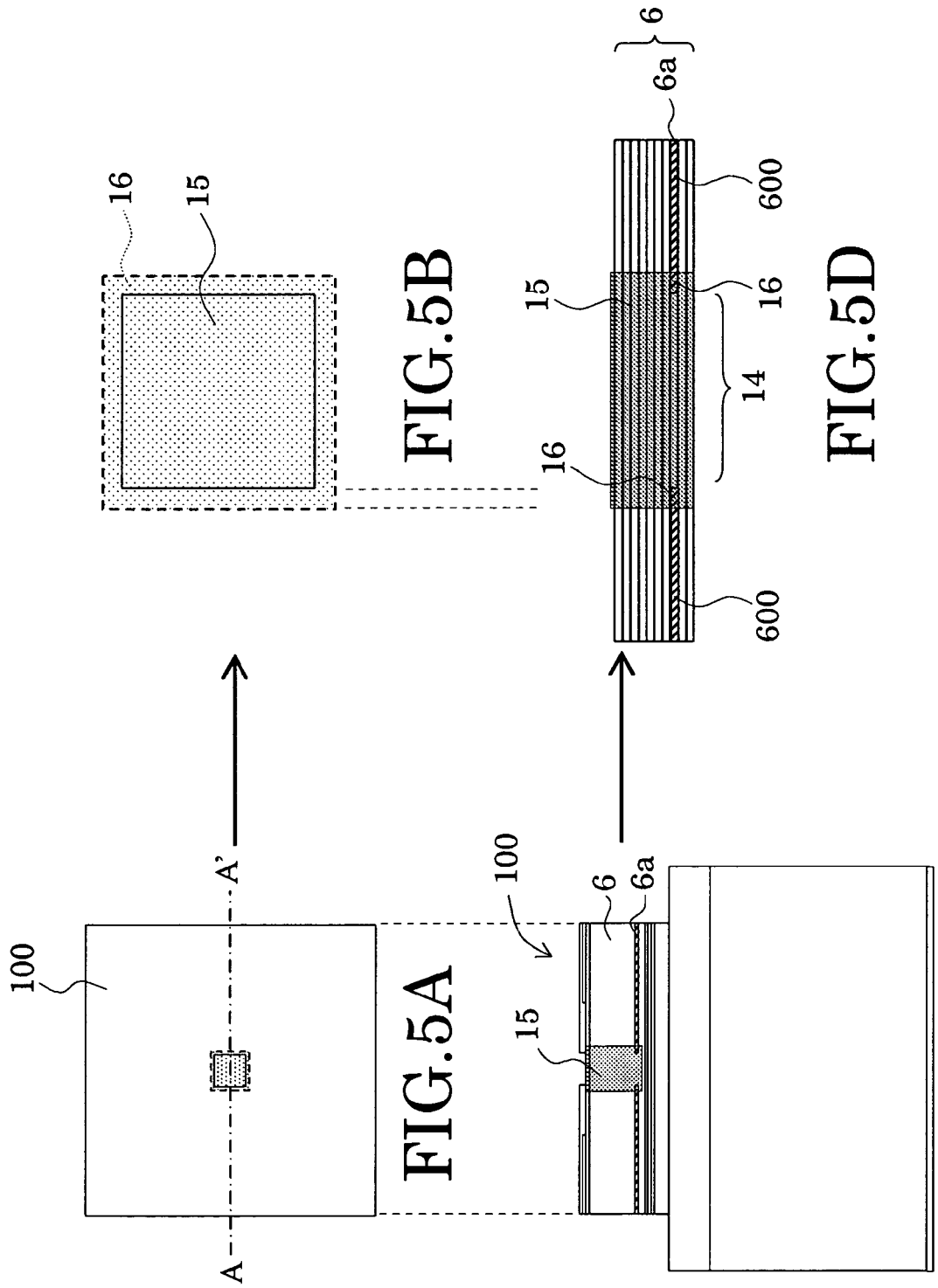

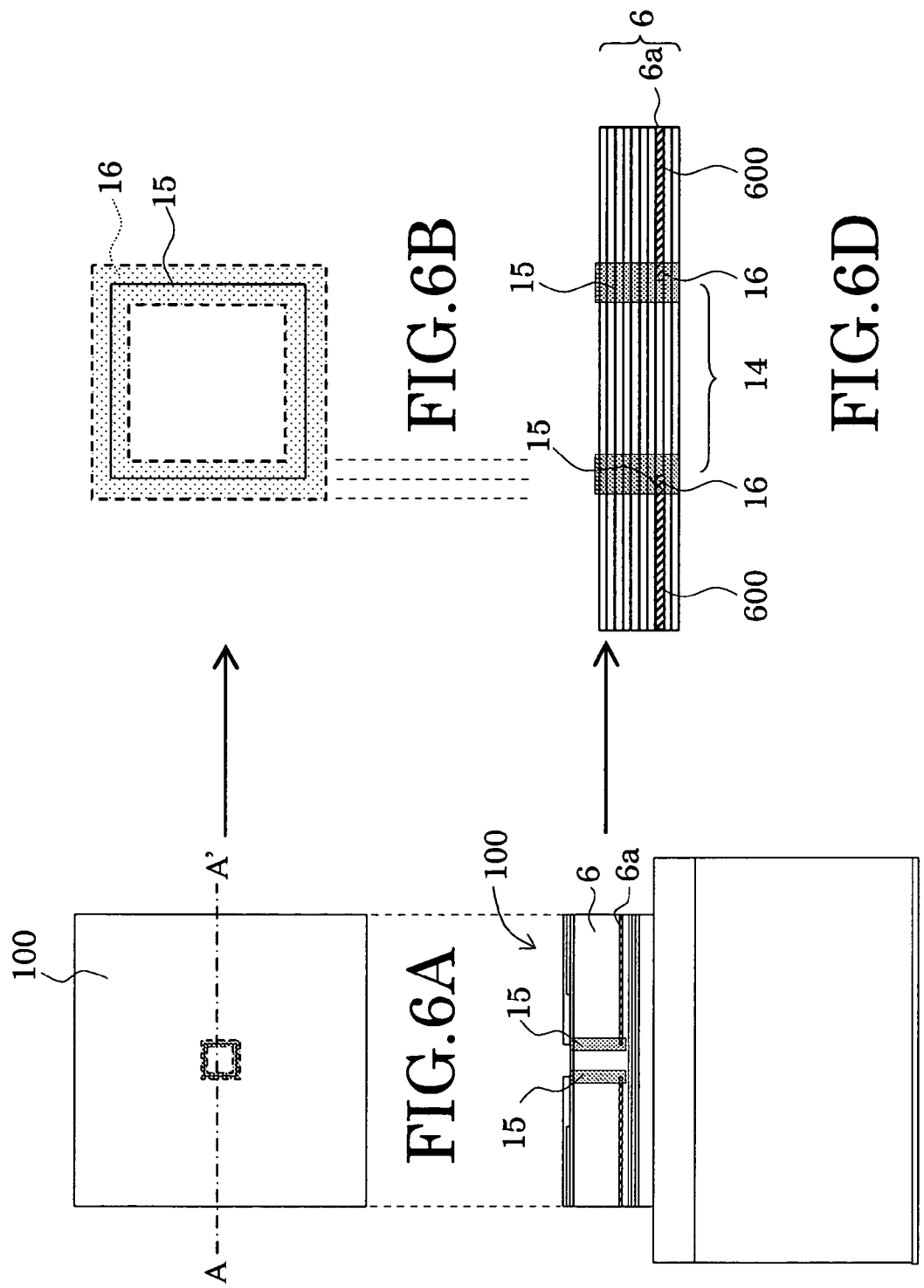

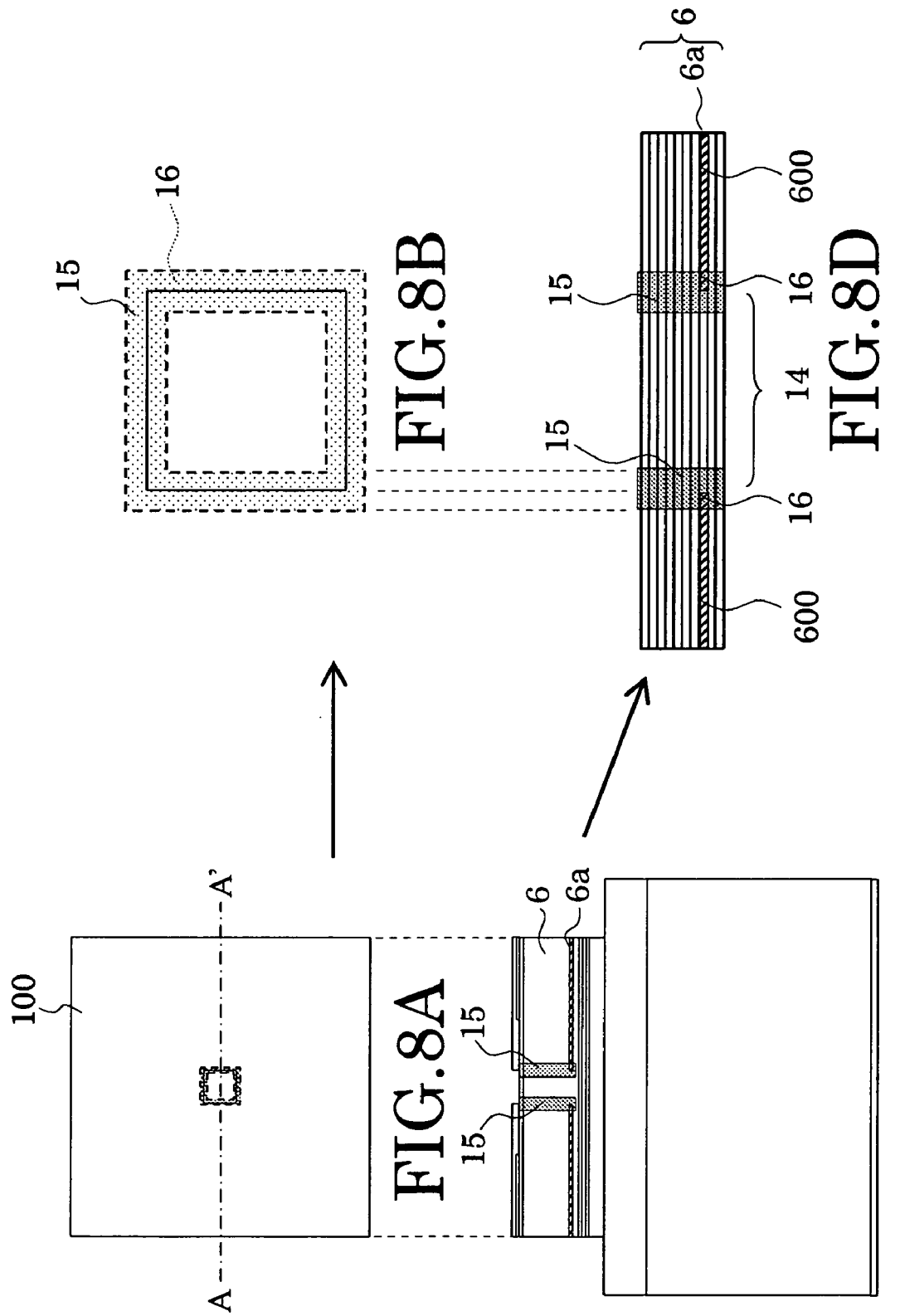

prior art present invention

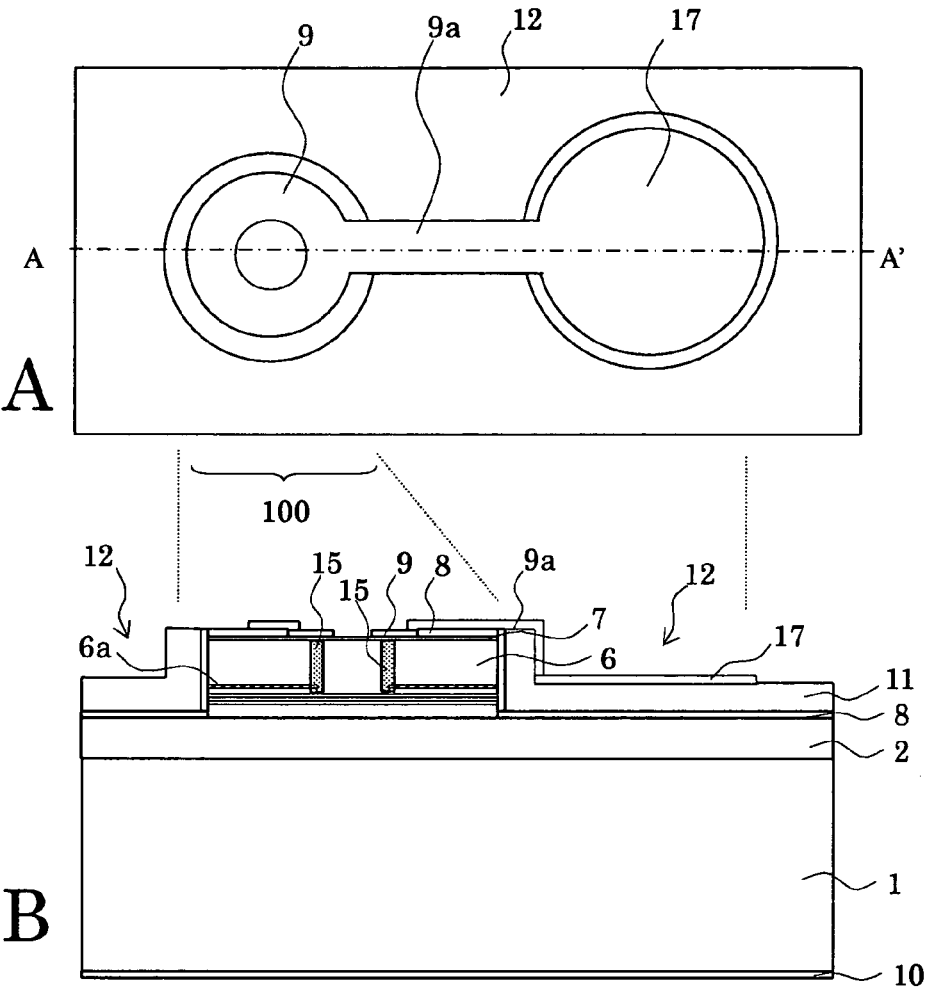
FIG. 10A
FIG. 10B
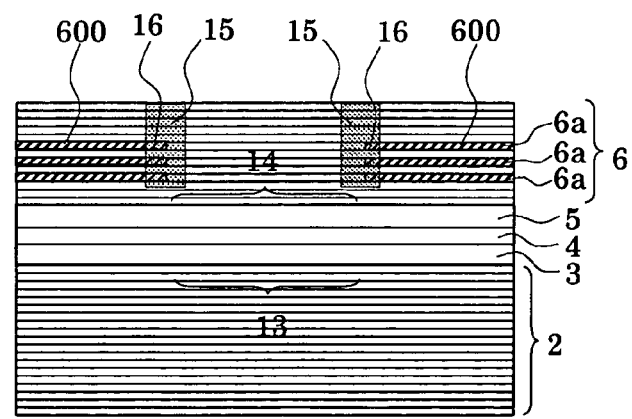
FIG. 10C

VERTICAL-CAVITY SURFACE EMITTING LASER DIODE AND ITS MANUFACTURING METHOD

CROSS-REFERENCE TO RELATED APPLICATIONS

This application is based upon and claims the benefit of priority from the prior Japanese Patent Application No. 2002-342085, filed on Nov. 26, 2002; the entire contents of which are incorporated herein by reference.

BACKGROUND OF THE INVENTION

The present invention relates to a vertical-cavity surface emitting laser (VCSEL) diode and its manufacturing method, and more particularly it relates to a surface emitting laser diode where a micro structure for current confinement can be formed precisely and its manufacturing method.

Semiconductor light emitting elements, such as a semiconductor laser and a semiconductor light emitting diode, are commonly used for an optical-communication system, an optical disc system or a bar code reader system, such as CD (Compact Disc) system and DVD (Digital Versatile Disc) system, etc.

Among the semiconductor light emitting elements, a VCSEL diode configures an optical cavity structure using an active layer sandwiched between a pair of mirror stack and emits a laser beam perpendicularly to a surface of semiconductor surface.

In the case of the VCSEL diode, many laser elements can be integrated in two dimensions on the substrate, therefore, it attracts a big attention as a key device in high-speed optical LAN (Local Area Network) and the optical electronics fields, such as optical interconnects.

The following points can be mentioned as the characteristics of the VCSEL diode:

Compared with the conventional edge emitting laser diode, the VCSEL has many advantages such as a low threshold current operation, low power consumption, high slope efficiency, capable of high speed modulation, a low beam divergence for easy connection to fiber optics, requiring no edge cleavage, excellent in mass-production, etc.

The VCSEL requires a current confinement portion for efficiently injecting electric currents into an active region. A method for forming this current confinement portion is to form a high resistance region by means of proton (hydrogen ion) implantation and define a current aperture. Another method proposed is to form a structure comprising a layer to be selectively and laterally oxidized and use a non-oxidized region as a current aperture. These methods are disclosed in Japanese Patent Laid-Open Publication No.H09-266350, Japanese Patent Laid-Open Publication No.2000-332355 and Japanese Patent Laid-Open Publication No.2001-93897.

In the proton implantation method, a small difference of refractive index arises between a current injection region and its circumference by the so-called "thermal lens effect", with a weak optical confinement. In a VCSEL using proton implantation method, a laser beam with stable lateral transverse mode can be obtained by the weak optical confinement effect even if a diameter size of the confinement portion by proton implantation is about 10 micrometers.

On the other hand, the selectively oxidized VCSEL enables optical confinement as well as current confinement. Then index-guiding optical confinement is obtained because the refractive index is reduced from 3.0 for the original non-oxidized layer to 1.6 for the oxidized layer. For this reason, it is necessary for oxide-confined VCSEL to narrow the diameter of the current confinement portion compared with that for the proton implanted VCSEL, typically to 5 micrometers or less in order to stabilize the lateral transverse mode. That is, in the case of the selective oxidation method, it is required to make the diameter of the oxide-confined aperture minute in order to control the lateral transverse mode.

It is not impossible in fabrication process to form the diameter of the current aperture in 5 micrometers or less. However, since it is difficult to control and reproduce the size and the shape of the diameter of the oxide-confined aperture, it is hard to carry out mass-producing and raising a production yield.

The manufacture method of the oxide-confined VCSEL will be explained briefly, and the control and reproducibility of the size and shape of the diameter of current aperture, which is a problem, will be explained.

First, a laser wafer is made by growing a semiconductor multilayer film reflector, a cladding layer, a semiconductor active layer, a cladding layer, a semiconductor multilayer film reflector, and a contact layer on the semiconductor substrate in this order. The semiconductor multilayer film reflector has a laminated structure of a repetition of an $Al_xGa_{1-x}As$ film/$Al_yGa_{1-y}As$ film, and an $Al_zGa_{1-z}As$ ($z>0.95$) film as the oxidizee layer (a layer to be oxidized and/or a layer that has been oxidized) with higher aluminum content than the other part of the semiconductor multilayer film reflector.

Next, a mesa structure is formed by etching a semiconductor substrate, and further, a substrate is heated up to 400 degrees centigrade or more in steam atmosphere. Then, the AlGaAs film with higher aluminum content among the semiconductor films, which constitute the semiconductor multilayer film reflector is oxidized selectively from the exposed part of the side of the mesa, and becomes an Al—Ga—O film. The oxidization rate varies remarkably in accordance with the composition of aluminum. For example, if $z=0.95-1$ in $Al_zGa_{1-z}As$, aluminum high concentration layer can be oxidized selectively without affecting the cladding layers and other layers hardly.

In the selective oxidation process of the lateral direction, the oxidization of the oxidizee layer proceeds from the side wall of the mesa, and the oxide-confined current aperture is formed at the perimeter part of the mesa, and the part which is not oxidized i.e. the opening is formed in the center of the mesa. The shape and the size of the opening which is not oxidized of the oxidized layer with high aluminum content, can be controlled by adjusting the temperature and time of the heat treatment appropriately.

As explained above, the current aperture for the oxide-confined VCSEL is produced by oxidizing an AlAs layer or an AlGaAs layer with high aluminum content selectively and laterally from the side wall of the mesa structure.

However, an oxidization rate is determined by the substrate temperature, the thickness of oxidizee layer, aluminum composition, the flux of steam, the flux of nitrogen gas, etc., and varies by the conditions of the process much in the selective oxidation process by wet oxidization. For this reason, when carrying out selective oxidation of the AlAs layer or AlGaAs layer with high aluminum content, there is a problem that it is difficult to control the size and shape of a non-oxidized part (opening part) with sufficient reproducibility.

In order to solve this problem, the real time monitoring of the wet oxidation process was tried in order to improve the controllability of oxide-confined aperture size. For example, a method of observing the image of an actual oxide-confined VCSEL with a CCD camera by utilzing the reflectance difference of an AlAs layer and $Al_2O_3$ oxide layer due to the refractive-index difference is disclosed by Wright State Univ., IEEE Photon Technol. Lett. 10, p.197(1998).

However, even if this method is used, it is difficult to measure and to control the sizes and the shapes of all oxide-confined apertures of VCSEL diodes over the whole of a semiconductor substrate. It turned out that it is very difficult to control the size and the shape of oxide-confined aperture with high precision, since the oxidization rate changes sensitively with the process conditions and "anisotropy oxidization" which will be explained below arises, especially when forming the current aperture size in 10 micrometers or less.

That is, when using the AlAs layer and AlGaAs layer which contain aluminum in high content as the selective oxidation layer, oxidization along the direction of <100> axes has an oxidization rate higher than the direction of <110> axes in an $Al_xGa_{1-x}As$ (x>0.94) layer. Thus, there is a problem that the shape of a non-oxidizing part changes with oxidization time in wet oxidation process since oxidization rate changes with crystal axis directions. This point will be explained in detail referring to examples.

Moreover, there is a problem that the volume of the oxidizee layer shrinks and the strain is introduced into the upper and the lower layers, when wet oxidation of the AlAs or AlGaAs with high Al content is carried out in the fabrication of oxide-confined VCSEL. Since the volume of oxide layer $Al_x(Ga)O_y$ shrinks compared with the Al(Ga)As layer (by about 7% through 13%), compressive stress is applied to the center of the active layer or the mesa structure after oxidization. In order to realize the current confinement effectively, the oxidizee layer as a current blocking layer needs to have a certain amount of thickness. However, the strain becomes larger as this oxidizee layer is made thicker. The strain is concentrated at the tip of the oxide layer. However, since the oxidizee layer is located as close as in only 0.2 micrometers from the active layer, this strain affects the part on which the current injects most in the active layer, and it reduces the life time of the VCSEL diodes.

Especially the tolerance over the heat process after the selective oxidation process falls. Therefore, there may be a problem that the compression stress may be applied to the active layer and the center of the mesa structure owing to the volume shrinking of aluminum high containing layer (the oxidizee layer), and the degradation of reliability, life time, and heat tolerance arise in the conventional oxide-confined VCSEL.

As mentioned above, there is a problem that it is difficult to control the size and the shape of the non-oxidized part used as the current aperture precisely and the laser characteristics, such as a threshold current and a light output, tend to vary in the conventional oxide-confined VCSEL diode.

Furthermore, in the oxide-confined VCSEL diode, there is a problem that since the volume of the oxidizee layer shrinks and strain is introduced into the upper and the lower layers when the wet oxidization of the AlAs or AlGaAs layer with high aluminum content is carried out, the degradation of reliability and life time and heat tolerance of a VCSEL diode arise.

SUMMARY OF THE INVENITON

According to an aspect of the invention, there is provided a VCSEL diode comprising a current confinement portion having a mesa including an oxidizee layer, the oxidizee layer having an oxidized part and a non-oxidized part, the oxidized part being formed by oxidizing the oxidizee layer from a side wall of the mesa, an electric current being injected on the non-oxidized part, the oxidizee layer having a proton-containing part including proton at a position substantially enclosing the non-oxidized part.

According to other aspect of the invention, there is provided a VCSEL diode comprising a current confinement portion having a mesa including an oxidizee layer, the oxidizee layer having an oxidized part and a non-oxidized part, the oxidized part being formed by oxidizing the oxidizee layer from a side wall of the mesa, and an electric current being injected on the non-oxidized part, the non-oxidized part including proton.

According to other aspect of the invention, there is provided a VCSEL diode comprising: a first and a second reflectors; an active layer provided between the first and the second reflectors; and an oxidizee layer having a non-oxidized part and an oxidized part provided around the non-oxidized part, an electric current being concentrated on the non-oxidized part, and the oxidizee layer having a proton-containing part including proton at least at a position substantially enclosing the non-oxidized part.

According to other aspect of the invention, there is provided a VCSEL diode comprising: a substrate; an active layer provided on the substrate and having a emitting part; a first and a second reflectors sandwiching the active layer therebetween and forming a laser cavity vertical to the substrate; a pair of electrodes provided to inject an electric current into the active layer; and an oxidizee layer provided above or below the active layer; a mesa being formed to include the oxidizee layer, and the oxidizee layer having an oxidized part of a high resistance extending from a side wall of the mesa to a proximity of the emitting part, a non-oxidized part of a low resistance surrounded by the oxidized part, and a proton-containing part including proton at least at a position substantially enclosing the non-oxidized part.

According to other aspect of the invention, there is provided a method of manufacturing a VCSEL diode having a current confinement structure having an oxidizee layer, the oxidizee layer having an oxidized part and a non-oxidized part, the oxidized part being formed by oxidizing a part of the oxidizee layer, an electric current being concentrated on the non-oxidized part, comprising: forming a proton-containing part in the oxidizee layer by selectively introducing proton into the oxidizee layer; and forming the oxidized part by oxidizing the oxidizee layer from an side face thereof to the proton-containing part.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings:

FIG. 1A is a plan view, FIG. 1B is an A–A' line section view of FIG. 1A, and FIG. 1C is a section view showing an enlarged part of the current confinement portion 14 of FIG. 1B;

FIG. 5A through FIG. 5D are schematic diagrams showing the example which proton are implanted into the whole current confinement portion 14 of laser, where FIGS. 5B and 5D are partly enlarged views of FIGS. 5A and 5C, respectively;

FIG. 6A through FIG. 6D are schematic diagrams showing a example of the VCSEL diode in which the proton implantation part is provided, where FIGS. 6B and 6D are partly enlarged views of FIGS. 6A and 6C, respectively;

FIG. 8A through FIG. 8D are schematic diagrams showing the example in which the pattern width of the proton implantation part 15 is set up corresponding to the anisotropy oxidization rate, where FIGS. 8B and 8D are partly enlarged views of FIGS. 8A and 8C, respectively;

FIG. 10A through FIG. 10C are schematic diagrams tshowing the VCSEL diode of the modification of the embodiment, where FIG. 10A is a plan view, FIG. 10B is an A–A' line section view of FIG. 10A, and FIG. 10C is a section view showing an enlarged part of the current confinement portion 14 of FIG. 10B;

FIG. 11A is a plan view, FIG. 11B is the A'–A line sectional view of FIG. 11A, and FIG. 11C is the B'–B line sectional view of FIG. 11A; FIG. 12A is a plan view, FIG. 12B is the A'–A line sectional view of FIG. 12A, and FIG. 12C is the B'–B line sectional view of FIG. 12A.

DETAILED DESCRIPTION

Referring to drawings, some embodiments of the present invention will now be described in detail.

First Embodiment

Figure 1A:
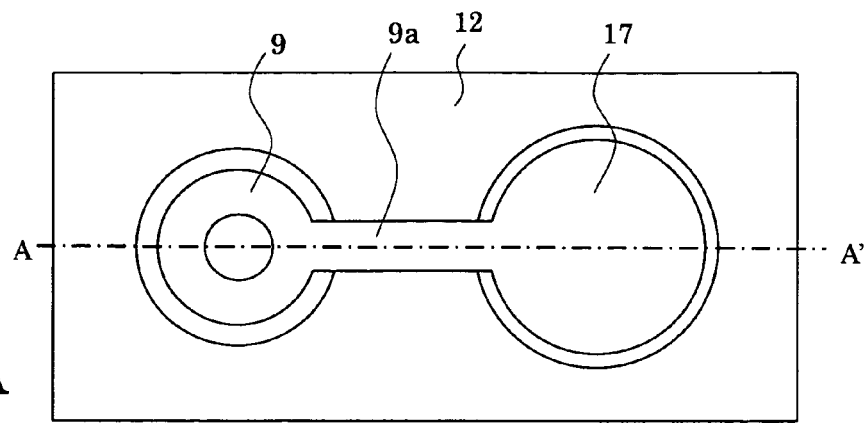
FIG. 1A through FIG. 1C are schematic diagrams showing the structure of the VCSEL diode according to the first embodiment of the present invention, where
Figure 1B:
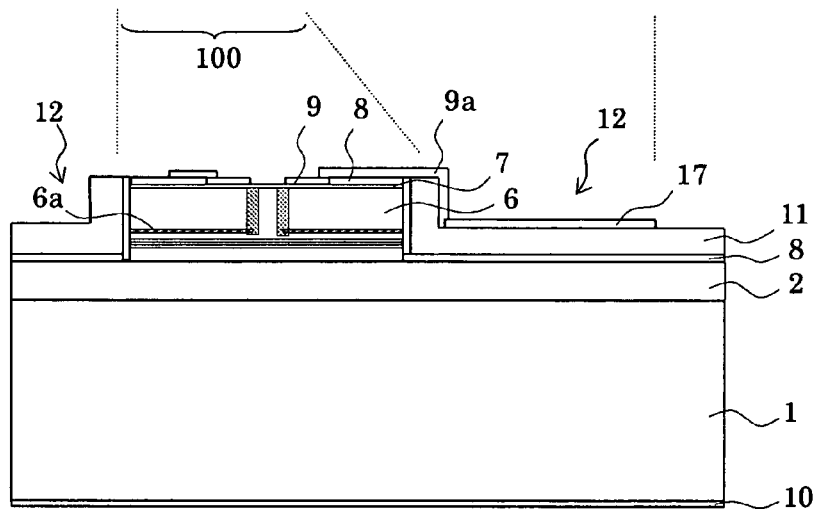
Figure 1C:
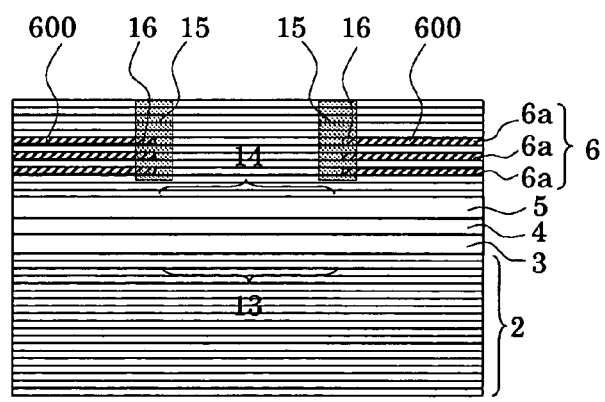

FIG. 1A through FIG. 1C are schematic diagrams showing the structure of the VCSEL diode according to the first embodiment of the present invention. FIG. 1A is a plan view, FIG. 1B is an A–A' line section view of FIG. 1A, and FIG. 1C is the section view showing an enlarged part of the current confinement portion 14 of FIG. 1B.

This VCSEL diode has a semiconductor active layer 4 which is formed on the substrate 1 having the light emitting part 13, the first semiconductor multilayer film reflector 6 and the second semiconductor multilayer film reflector 2 which is formed on same side of the semiconductor active layer 4 as the substrate 1. The first semiconductor multilayer film Bragg reflector 6 is formed on opposite side of the semiconductor active layer 4 to the substrate 1. The semiconductor active layer 4 forms a vertical cavity to the substrate 1. The semiconductor cladding layer 3 is formed under the semiconductor active layer 4, and the semiconductor cladding layer 5 is formed on the semiconductor active layer 4.

The semiconductor multilayer film reflectors 2 and 6 have the structure where at least two kinds of semiconductor layers which have different refractive indexes are laminated by turns. The thickness in the optical wavelength of each semiconductor layer is ¼ of the wavelength of the laser light. Such a multilayer film reflector is called DBR (distributed Bragg reflector), for example.

The contact layer 7 is formed on the first semiconductor multilayer film reflector 6, and the contact electrode 9 to inject the current into the light emitting part 13 through the contact layer 7 is formed. And, the contact electrode 9 is formed so that the top of light emitting part 13 may be opened.

The electrode 10 is formed in the back side of the substrate 1, and the current is made to be injected to the light emitting part 13 through the second semiconductor multilayer film reflector 2.

The first semiconductor multilayer film reflector 6, the semiconductor active layer 4, the semiconductor cladding layer 3, and the semiconductor cladding layer 5 form the protruding mesa part 100. The etching part 12 for forming the mesa is provided around the mesa part 100 including the first semiconductor multilayer film reflector 6 and the semiconductor active layer 4.

Either of the semiconductor layers which constitute the first semiconductor multilayer film reflector 6 is the oxidizee layer 6a which contains high aluminum (Al) content. The oxidizee layer 6a has the oxidization part 600 oxidized and formed in the lateral direction toward the light emitting part 13 from the side wall of the mesa part 100, and the inner side of the oxidization part 600 is the current confinement portion 14. And the proton implantation part 15 is formed in the tip of the oxidization part 600. The proton implantation part 15 has the role of reducing the oxidization rate of the oxidizee layer 6a and controlling the aperture shape of the current confinement portion 14. The current path to the light emitting part 13 can be narrowed down by the current confinement portion 14 formed as mentioned above.

In addition, although the case where three layers of the oxidizee layer 6a are provided is illustrated, the present invention is not limited to this example but one layer, two layers or more than three layers of oxidizee layer 6a may be provided.

Polyimide 11 is formed on the surface of the etching part 12 for mesa formation, and the bonding pad 17 is formed on the polyimide 11. The bonding pad 17 is connected to the contact electrode 9 by the wiring 9a.

Since the VCSEL diode of this embodiment has the proton implantation part 15, when the oxidized layer 6a is oxidized in a lateral direction toward the light emitting part 13 from the side wall of the mesa part 100, the oxidization rate can be slowed down greatly in proportion to the content of proton concentration in the part 16 into which proton are implanted in the oxidizee layer 6a.

Figure 2A:
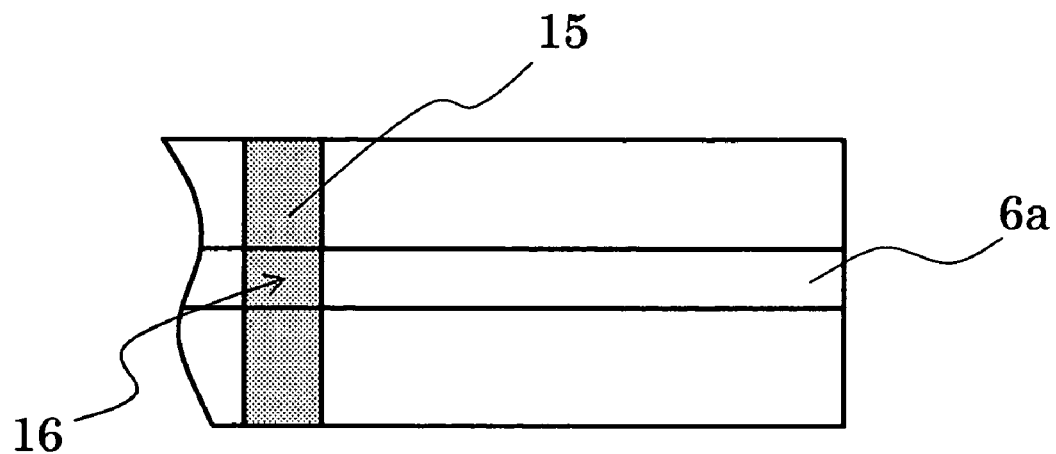
FIG. 2A through FIG. 2C are process section views showing the process in which the oxidizee layer 6a is oxidized in the embodiment of the invention.
Figure 2B:
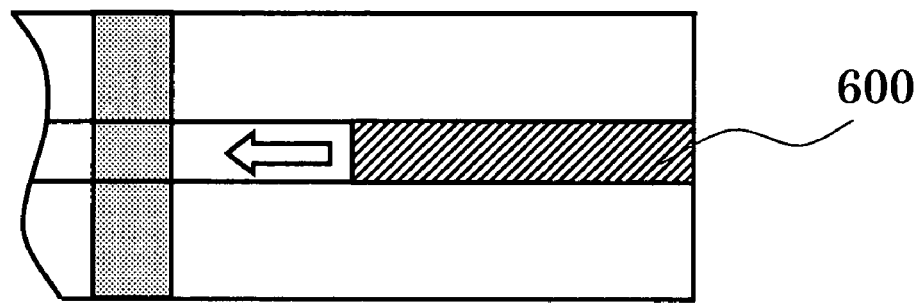
Figure 2C:
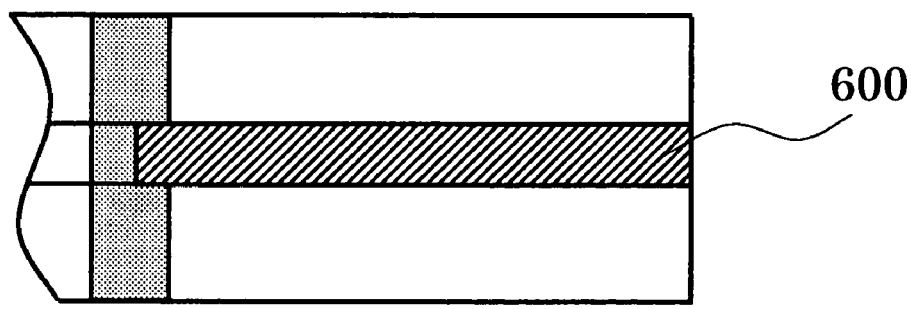

FIG. 2A through FIG. 2C are process section views showing the process in which the oxidizee layer 6a is oxidized in this embodiment. That is, as expressed in FIG. 2A, the edge of the oxidizee layer 6a is exposed to the side of the mesa, and the proton implantation part 15 into which proton are implanted is formed in the mesa, and the part 16 in which proton are implanted is also provided in the oxidizee layer 6a.

Subsequently, if oxidization from the edge of the oxidized layer 6a exposed to the side of the mesa is carried out, the oxidization part 600 will spread to the direction expressed by an arrow in this figure, as expressed in FIG. 2B.

And, when the oxidization part 600 reaches in the proton implantation part 15, the oxidization rate will fall and the tip of the oxidization part 600 can be easily made to stop in this part 15, as expressed in FIG. 2C. In the invention, the oxidization rate can be decelerated to about 1/5 by comparatively low proton concentration of about $1 \times 10^{18}/cm^3$, as explained in detail later. Therefore, it becomes easy to stop oxidization in the proton implantation part.

As a consequence, when the current confinement portion 14 is formed by oxidizing the oxidizee layer 6a from the side wall of the mesa part 100, the size and the shape of the light emitting part 13 can be controlled precisely. Moreover, it becomes possible to control the "variation" in the size of the current confinement portion 14 among many VCSEL devices formed on a same wafer, and also to control the shape of the strain of the current confinement portion 14 deformed by anisotropy oxidization.

In result, the controllability, uniformity and reproducibility of the size and the shape of the emitting beam pattern is raised, and the variation among same devices in laser characteristics including a threshold current and voltage, an optical output power and transverse mode control is also suppressed in production of the oxide confined VCSEL diode. And the VCSEL diode device with high performance can be mass-produced by a high yield.

Figure 3:
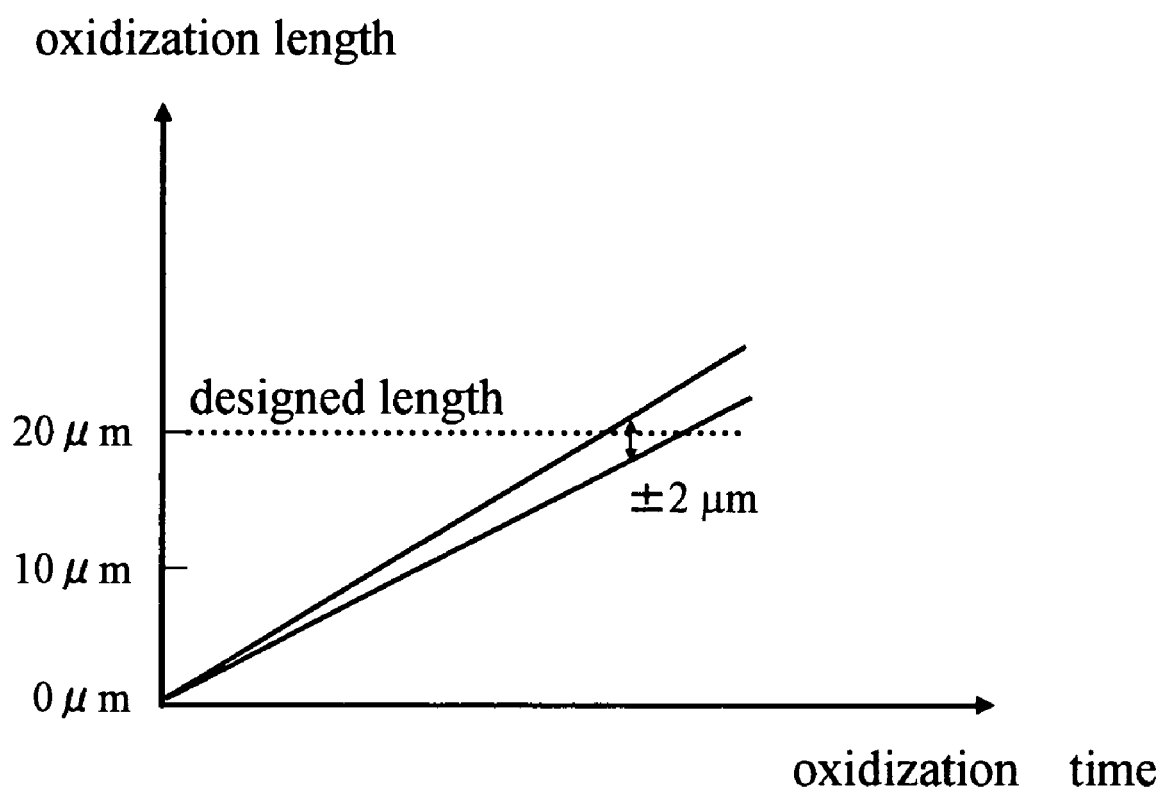
FIG. 3 is a graphical representation showing the change of oxidization length to oxidization time when carrying out steam oxidization of the AlGaAs layer which contains high Al content.

FIG. 3 is a graphical representation showing the change of oxidization length to oxidization time when carrying out wet oxidization of the AlGaAs layer which contains high Al content. Here, "oxidization length" is the length of the oxidization part measured from the edge of AlGaAs exposed to steam atmosphere. From this figure, it turned out that the reproducibility of the oxidization rate includes the error of the order of plus-minus 10% and that it is difficult to control the reproducibility sufficiently and precisely with the present oxidization process.

For example, when the VCSEL whose mesa 100 is 45-micrometer angle and the aperture of the current confinement portion 14 is 5-micrometer angle is formed, the oxidization length of the oxidizee layer 6a from a side wall is set as 20 micrometers. The reproducibility of the oxidization rate of the oxidizee layer 6a usually includes about "variation" of about plus-or-minus 10%. Then in the case of a selective oxidization process without the proton implantation part 15, the oxidization length is set to 20-micrometer plus-or-minus 2 micrometers (namely, 18 micrometers–22 micrometers) Therefore, the size of the current confinement portion 14 (current aperture) becomes (the mesa size 45)– 2×(the oxidization length 20 plus or minus 2)=5 plus-or-minus 4 micrometers, and the accuracy of size of the current confinement portion 14 will also change for plus-or-minus 80% to a desired value. Thus, when the size (beam size) of the desired current confinement portion 14 becomes 10 micrometers or less, the rate of change of the actual size to a desired value will become very large.

In contrast, since the VCSEL diode of this embodiment has the proton implantation part 15, when the selective oxidation of the oxidizee layer 6a is carried out to a lateral direction toward the light emitting part 13 from the side wall of the mesa part 100, the oxidization rate of the oxidizee layer 6a is greatly slowed down in almost proportion to the content of proton concentration in the part 16 into which proton are implanted.

Figure 4A:
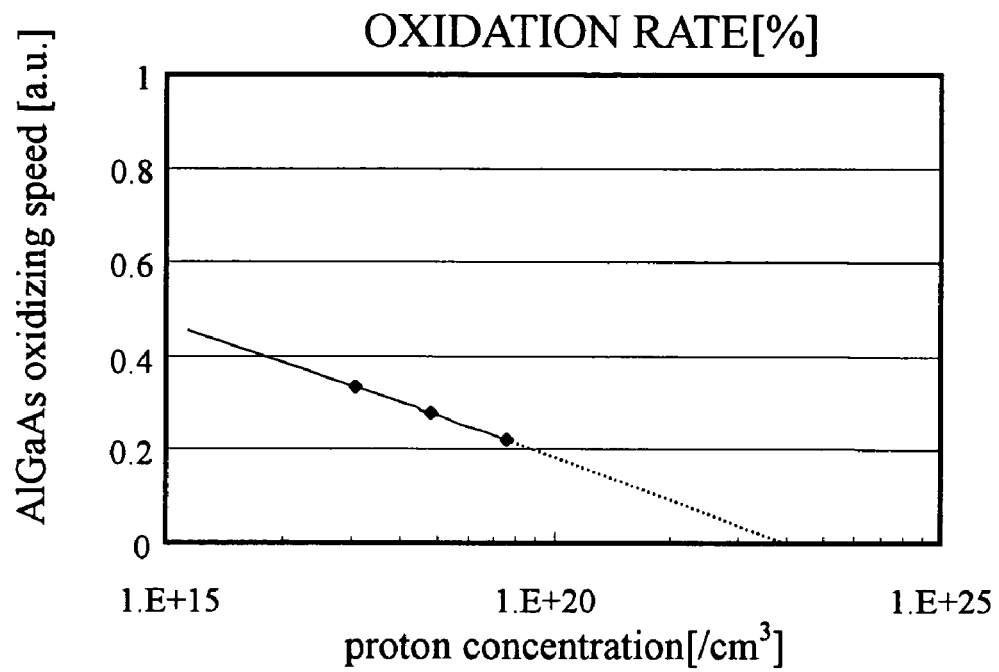
FIG. 4A is a graphical representation showing the dependence of the oxidization rate on the proton concentration when the AlGaAs layer with high aluminum content is laterally oxidized.

FIG. 4A is a graphical representation showing the dependency of the oxidization rate on the content of proton concentration when the AlGaAs layer which contains high aluminum content is laterally oxidized. That is, the horizontal axis of this figure expresses the proton concentration contained in an AlGaAs layer, and the vertical axis expresses a relative oxidization rate when setting the oxidization rate to "1" when being formed without proton.

FIG. 4A shows that the oxidization rate of the AlGaAs layer which contains high aluminum content can be greatly slowed down to about 20% of it, when proton are implanted so that it may become about $1 \times 10^{18}/cm^3$ concentration.

The technology of making a semiconductor layer into high resistance by implanting proton has been used conventionally.

In order to make the semiconductor layer into high resistance, it is necessary to implant proton of about $1 \times 10^{15}/cm^2$ as dose amount, typically. If this is converted into concentration, it will be set to about $1 \times 10^{20}/cm^3$.

On the other hand, according to the present invention, the oxidization of the semiconductor layer can fully be decelerated by the proton of the quantity of about 1/10 through 1/100. That is, the concentration of proton can be set to $1 \times 10^{18}/cm^3$ with an about $5 \times 10^{13}/cm^2$ dose amount, and the oxidization of the semiconductor layer can fully be decelerated as mentioned as an example later.

That is, according to the present invention, the oxidization rate can be reduced without making the semiconductor layer into high resistance. Therefore, it is also possible to implant proton into the whole active part of laser.

FIG. 5A through FIG. 5D are schematic diagrams showing the example which proton are implanted into the whole current confinement portion 14 of VCSEL structure. Namely, FIG. 5A is the plan view of the principal part, FIG. 5B shows an enlarged part of FIG. 5A, FIG. 5C is the A–A' line section view of FIG. 5A and FIG. 5D is the A–A' line section view of FIG. 5B.

In this example, the proton implantation part 15 is provided so that the whole current confinement portion 14 may be covered. It is possible to prevent the advance of the oxidization and to form the current confinement aperture precisely, without making resistance of the current confinement portion 14 not so high by adjusting the proton implantation condition appropriately.

Figure 4B:
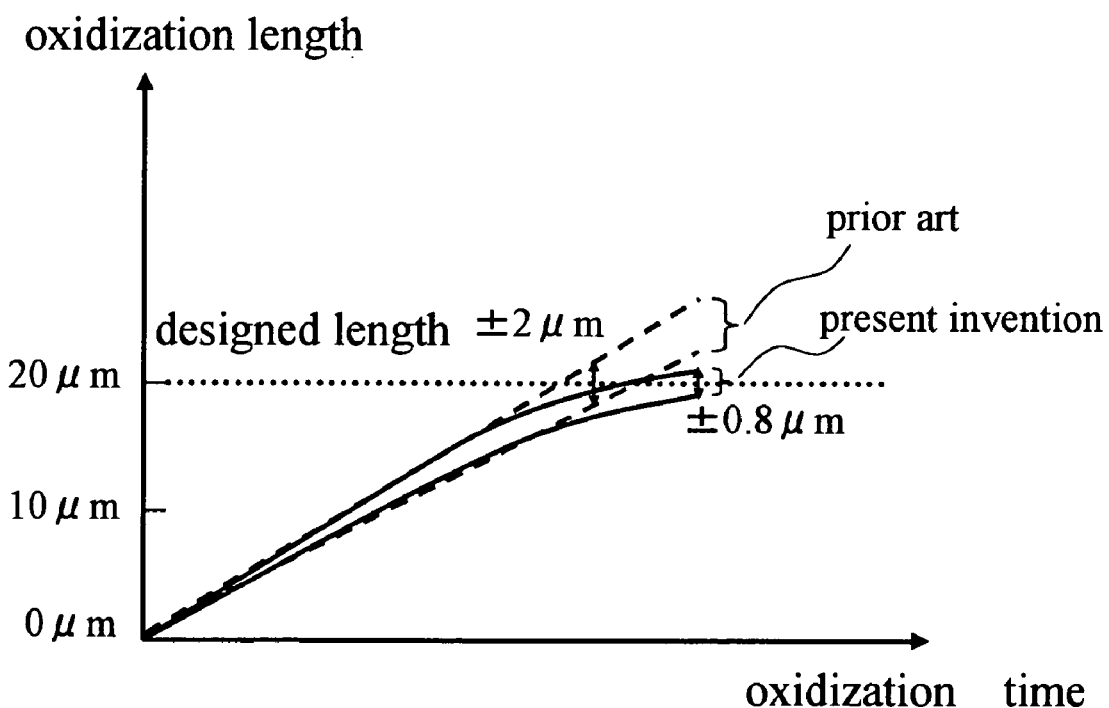
FIG. 4B is a graphical representation which shows the reproducibility of the change of the oxidization length to the oxidization time of an Al(Ga)As layer of the embodiment and that of the conventional example (FIG. 3)

FIG. 4B is a graphical representation which shows the reproducibility of the change of the oxidization length to the oxidization time of an Al(Ga)As layer of this embodiment and that of the conventional example (FIG. 3).

In this embodiment, it turns out that by controlling the advance of oxidization in the proton implantation part 16 of the AlGaAs layer which is the oxidizee layer 6a, the change of oxidization length from the desired value can be controlled below in half from plus-or-minus 2 micrometers to plus-or-minus 0.8 micrometers.

FIG. 6A through FIG. 6D are schematic diagrams showing an example of the VCSEL diode in which the proton implantation part is provided. Namely, FIG. 6A is the plan view of the principal part, FIG. 6B shows an enlarged part of FIG. 6A, FIG. 6C is the A–A' line section view of FIG. 6A and FIG. 6D is the A–A' line section view of FIG. 6B.

Proton are implanted into the part between a square with 4 micrometers on a side and a square with 6 micrometers on a side, as expressed in FIG. 6A through FIG. 6C. And the proton implantation concentration of the oxidizee layer 6a within the part between a square with 4 micrometers on a side and a square with 6 micrometers on a side and an Al(Ga)As layer is set to $1 \times 10^{18}/cm^3$.

Moreover, the advance of oxidization is controlled by the proton implantation part 15 (16) formed in the part which becomes being the usual accuracy within plus-or-minus 10% with the request size of the current confinement portion 14, and oxidization length reproduces the reproducibility of oxidization rate as a result in 20 plus-or-minus 0.8 micrometers (namely, 19.2 micrometers–20.8 micrometers) accuracy. That is, the diameter of the aperture of the current confinement portion 14 is set to (45 micrometers of diameters of mesa)–(oxidization length 20 plus-or-minus 0.8 micrometers)=5 plus-or-minus 1.6 micrometers.

At this time, the rate of change to a desired value is reduced to plus-or-minus 32%. This shows that about 50% of improvement is achieved compared with conventional 80% as for the rate of change, and the controllability of the size of the current confinement portion is improved greatly.

Moreover, the invention becomes very effective for the improvement of the controllability, reproducibility, and uniformity of the diameter of the aperture of the current injecting area 14, when the diameter of the oxide-confined aperture of the current injecting area 14 is less than 10 micrometers from which the rate of change of the size to a desired value becomes large in conventional oxide-confined VCSEL devices. The effect of double confinements in oxide-confined VCSEL is acquired and the high performance such as operation (substitute mA) with very low threshold current can be attained, by reducing the diameter of the current confinement portion to less than 10 micrometers.

On the other hand, according to this embodiment, a distortion of the form by anisotropy oxidization can also be rectified.

Figure 7:
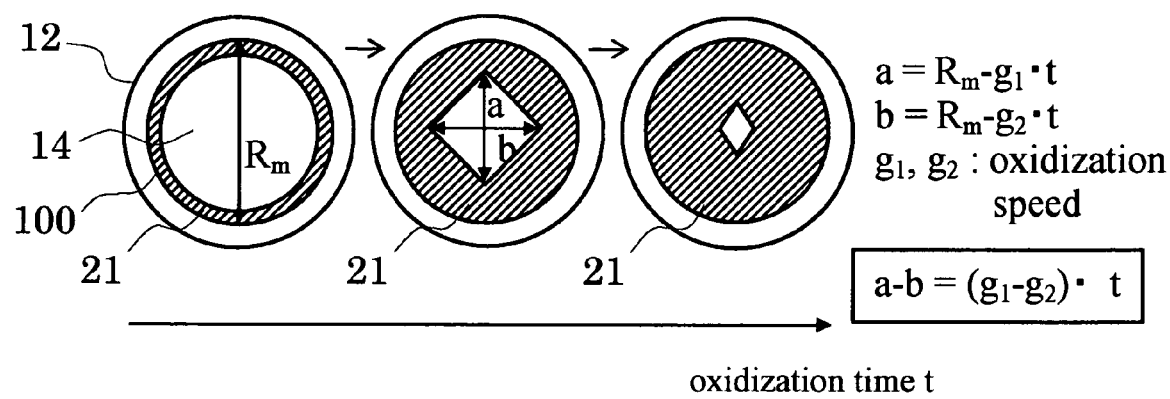
FIG. 7 is a section view showing the change of the shape of the current injecting area 14 and the oxidization part 600 to the oxidization time when oxidizing the oxide layer-ed of the cylindrical mesa 100 from the side without providing the proton implantation part 15, and the situation of anisotropy oxidization.

FIG. 7 is a section view showing the change of the form of the current concentrating area 14 and the oxidization part 600 to the oxidization time when oxidizing the oxidizee layer of the cylindrical mesa 100 from the side without providing the proton implantation part 15, and the progress of anisotropy oxidization. In addition, the symbol 12 in this figure expresses the substrate of the circumference of the mesa.

The oxidization part 21 spreads with the increase in oxidization time. It turns out that the non-oxidized part 14 becomes the shape of a lozenge which makes the direction expressed with arrow a and b the tips, since the oxidization rate in the directions expressed with the arrows a and b are slow. Moreover, this figure also shows that a difference in every direction of this rhombus is expanded when the oxidization time becomes long.

Thus, controlling the shape and size of oxide-confined aperture has the problem of it being difficult, and a light emitting part (non-oxidizing part, current confinement portion) size and shape, and transverse mode control being difficult, and being easy to produce the "variation" in the laser characteristics, such as the threshold current and voltage and an optical output power, by a selective oxidation method.

On the other hand, according to this embodiment, the distortion of shape of oxide-confined aperture can be restricted by devising the pattern size and the arrangement of the proton implantation part 15 with reference to the oxidization rates along the crystal axis directions. In the case where the mesa is a square of a size of 45 micrometers and the current confinement part 14 of a square of a size of 5 micrometers is formed by the selective oxidation process, the width of the proton implantation part 15 is made into about 2 micrometers along the direction where the oxidation rate is high, while the width the proton implantation part 15 is made into about one micrometer along the direction where the oxidation rate is low as shown in FIGS. 8A through 8D. That is, the proton implantation part 15 is made between 4-micrometer and 6-micrometer along the direction where the oxidation rate is high, and is made between 5-micrometer and 6-micrometer along the direction where the oxidization rate is low. That is, the pattern width of the proton implantation part 15 is set up according to the anisotropy of the oxidization rates.

When a selective oxidation process is performed to the structure where the ion implantation has been performed so that the proton implantation concentration of the oxidizee layer 6a, i.e., an Al(Ga)As layer, may be set to $1 \times 10^{18}/cm^3$, the anisotropy of the current injecting area 14 is eased and the shape of a desired square and the current injecting area 14 of a size are obtained. The anisotropy of the current confinement portion 14 is reduced to 0.1 micrometers instead of 0.7-micrometer size difference by length and its side in the conventional method, by adjusting the pattern of the proton implantation part 15 in this embodiment.

Figure 9A:
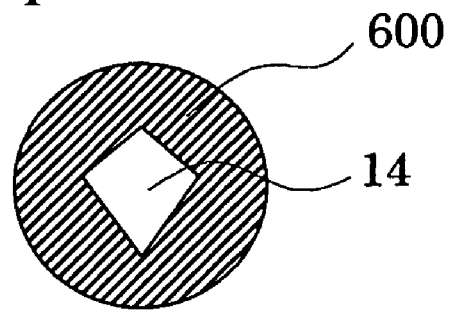
FIG. 9A is a plan view showing the form of the current confinement portion 14 without the proton implantation part.

Moreover, when the off-angled substrate where the major surface of the substrate is inclined from a direction such as the usual (100) plane is used as the substrate 1, the distortion of the shape by anisotropy oxidization becomes still more remarkable. For example, the form of the aperture (the current confinement portion 14) becomes the strained rhombus (an off-angle is about 10 degrees, here) in mesa with circle shape, as expressed in FIG. 9A.

On the other hand, the oxidization rate of each direction in an off-angled substrate is determined first, and then, the pattern of the proton implantation part 15 can be determined so that the desired size and shape are acquired in this embodiment.

Figure 9B:
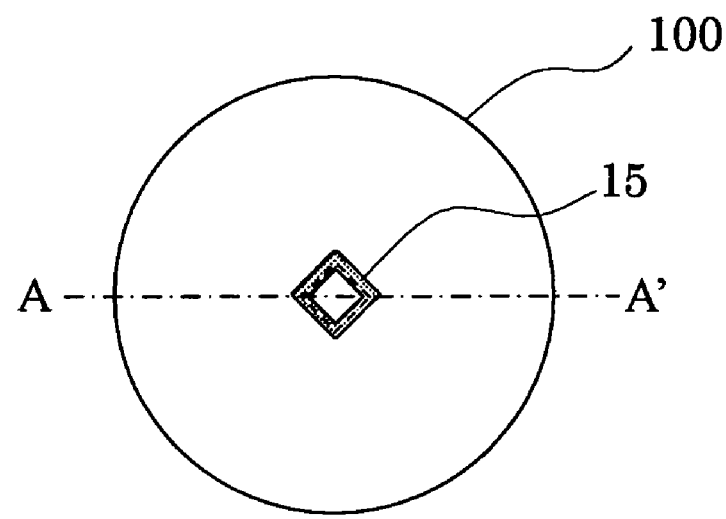
FIG. 9B is a plan view showing the pattern of the proton implantation part 15 with an inclined substrate.
Figure 9C:
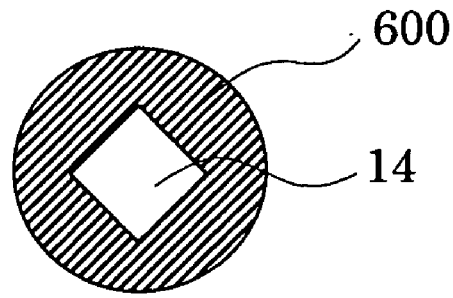
FIG. 9C is a plan view showing the current confinement portion 14 with the shape and the size of a desired square according to the embodiment of the invention.

FIG. 9B is a plan view showing the pattern of the proton implantation part 15 at the time of using an off-angled substrate. A selective oxidation process is performed from the mesa side after ion implantation processing using this pattern on the conditions from which desired concentration is obtained by the proton implantation part 16 of the oxidizee layer 6a. Consequently, the current confinement portion 14 having the shape and size of a desired square are obtained as expressed in FIG. 9C. For example, in the conventional example (FIG. 9A), about 1.1 micrometers of size differences in length and width have arisen. On the other hand, in this embodiment (FIG. 9C), the size difference in length and width can be reduced even down to 0.1 micrometers.

It has turned out to be preferable to form the proton implantation part having a proton concentration higher than $1 \times 10^{17}/cm^3$ and a width of a range of 1–10 micrometers, in order to establish a high controllability of the current aperture shape, and also in order not to increase oxidization time and electric resistance.

Next, the manufacturing method of the VCSEL of this embodiment shown in FIGS. 1A through 1C will be explained concretely.

First, by using MOCVD equipment an n-type semiconductor multilayer film reflector 2, a cladding layer 3, the semiconductor active layer 4, a cladding layer 5, and the oxidizee layer 6a which forms the current injecting area 14, a p-type semiconductor multilayer film reflector 6, and the contact layer 7 are grown one by one on the n-type GaAs substrate 1 of a diameter of 3 inches with a thickness of 400 micrometers and having a surface direction of (100).

The semiconductor multilayer film reflectors 2 and 6 are arranged at the upper and lower sides of the cavity which consists of a semiconductor active layer 4 and cladding layers 3 and 5. Hereafter, an example to form a GaInNAs VCSEL diode of 1.3-micrometer wavelength range will be explained.

In this case, the semiconductor multilayer film reflector 2 has a structure where GaAs layer (high refractive-index layer) and n-type $Al_yGa_{1-y}As$ (0<y<1) (low refractive-index layer) are laminated by turns with the thickness of the optical wavelength of ¼ of wavelength of 1.3 micrometers. In this example, the $Al_{0.94}Ga_{0.06}As$ layer with aluminum composition y=0.94 can be used as a low refractive-index layer.

Moreover, a dopant concentration can be set to $2\times10^{18}/cm^3$, using silicon (Si) as an n-type dopant of the semiconductor multilayer film reflector 2. The cladding layer 3 is formed with an n-type GaInP.

The semiconductor active layer 4 has the quantum well structure where the $Ga_xIn_{1-x}As_yN_{1-y}$ ($0 \leq x \leq 1$, $0 \leq y < 1$) layer adjusted so that photo-luminescence peak wavelength might be 1.3 micrometers and the GaAs layer as a barrier layer are laminated by turns. Here, the three-layer structure where the GaAs layers are laminated to the upper and lower sides of the $Ga_xIn_{1-x}As_yN_{1-y}$ ($0 \leq x \leq 1$, $0 \leq y < 1$) layer is employed. The composition of In in the $Ga_xIn_{1-x}As_yN_{1-y}$ ($0 \leq x \leq 1$, $0 \leq y < 1$) layer which is a quantum well layer is made into 30% through 35%, the composition of nitrogen (N) is made into 0.5% through 1.0%, and the thickness is set to 7 nm.

The lattice constant of the $Ga_xIn_{1-x}As_yN_{1-y}$ ($0 \leq x \leq 1$, $0 \leq y < 1$) layer is set to $Ga_{0.66}In_{0.34}As_{0.99}N_{0.01}$ which has compressive strain of about 2.5%, controlling the composition to become larger than the n-type GaAs substrate 1. Thus, if a strain is introduced in this way, since the differential gain coefficient increases, a threshold current value can be reduced further rather than the case of non-strain condition.

The cladding layer 5 is taken as the p-type GaInP. And, the semiconductor multilayer film reflector 6 has a structure where p-type GaAs layer (high refractive-index layer) and p-type AlyGa1-yAs (0<y<1) (low refractive-index layer) are laminated by turns with the thickness of the optical wavelength ¼ of wavelength of 1.3 micrometers. The $Al_{0.94}Ga_{0.06}As$ layer with aluminum composition y=0.94 can be used for a low refractive-index layer like the n-type semiconductor multilayer film reflector 2.

As the p-type dopant for the semiconductor multilayer film reflector 6, carbon (C) is used. The dopant concentration is modulated along the depth direction, such that it becomes about $2\times10^{18}/cm^3$ near the quantum well layer 3 and it becomes about $1\times10^{19}/cm^3$ near the contact layer 7.

The oxidizee layer 6a is formed by increasing the aluminum composition ratio x of any one layer or two or more layers of the AlGaAs layers which constitute the semiconductor multilayer film reflector 6. Specifically as the oxidizee layer 6a, $Al_xGa_{1-x}As$ (x>0.98) can be used. An AlAs layer is used in this example. The contact layer 7 is made to be the p-type GaAs, C (carbon) is used as the p-type dopant, and the dopant concentration is made to be $2\times10^{19}/cm^3$.

Next, the mesa 100 is formed by etching to the upper part of the n-type semiconductor multilayer film reflector 2 by a photolithography and an etching. Specifically, ICP (Inductively Coupled Plasma) dry etching equipment performs etching processing by the mixed gas of $BCl_3$ (boron chloride) and nitrogen. Then, the mesa 100 is formed with the conditions which the anisotropic etching occurs, adjusting an antenna output, a bias output, and substrate temperature. Here, in order to fabricate the VCSEL structure which has the oxide-confined current aperture of 5-micrometer square, the etching in a perpendicular direction has been performed so that the mesa 100 of 45-micrometer square may be obtained.

Next, the proton implantation part 15 is formed. The implantation of proton is performed using the $SiO_2$ film 8 and a resist pattern for an implant mask. In the selective oxidation of the following process, oxidization rate is greatly slowed down in proportion to proton concentration in the proton implantation part 16 of the oxidizee layer 6a formed at this process. As mentioned above about FIG. 4A, the dependency of the oxidization rate of AlGaAs layer 6a on the proton concentration at the substrate temperature of 400 degrees centigrade shows that the oxidization rate falls to less than ⅓ when proton concentration is more than $1\times10^{17}/cm^3$.

If the concentration of proton is in a range between $1\times10^{17}/cm^3$ and $1\times10^{18}/cm^3$ or lower, the implantation part hardly becomes high resistance, since it is lower than the dope concentration of carbon (C) of the semiconductor multilayer film reflector 6. That is, if the concentration of proton is controlled in the predetermined range in the part where proton is implanted, the oxidization rate of the oxidizee layer 6a can be controlled and series resistance will not become high. Moreover, the implanted depth of proton and distribution can be controlled by the accelerating voltage, and the proton concentration which overlaps the current confinement portion 14 can be controlled by dose amount in the proton implantation process.

Specifically, ion implantation is performed by setting the accelerating voltage to 320 keV and a dose amount to $5\times10^{13}/cm^2$, so that the proton concentration of the ion implanted part 16 in the oxidizee layer 6a and an AlAs layer (here, located in a depth of 2.6 micrometers from the surface) may become $1\times10^{18}/cm^3$. Moreover, the pattern of the proton implantation part may be appropriately determined in order to control the size and degree of the anisotropy oxidization.

Next, heat treatment at 400 degrees centigrade through 450 degrees centigrade is performed in a steam atmosphere, the selective oxidation of the oxidizee layer. 6a is carried out to a lateral direction from the side of the mesa 100, and the oxidization part 600 is formed. Since the proton implantation part 15 has been already formed at this time, the oxidization along the lateral direction toward the light emitting part 13 from the side wall of the mesa 100 proceeds, oxidization rate is greatly slowed down in proportion to proton concentration in the proton implantation part 16 of the oxidizee layer 6a. That is, the oxidization stops in a proton implantation part and a desired size and shape of the current confinement portion (current aperture) may be acquired.

Since the variation in the current aperture size arises in the substrate in the selective oxidation process of conventional type in addition to the problem of the reproducibility of the oxidization rate, the uniformity of the size of oxidization length is low. In contrast to this, in the case of the VCSEL devices of this example, as a result of evaluating the variation of the current confinement aperture size within the wafer (three-inch wafer), 3-sigma value was improved by about 40% compared with the conventional type. Thus, it was also shown that a big effect to reduce the variation of size within a wafer can be obtained. Moreover, the size difference of the length and the width by strain of shape by anisotropy oxidization was also reduced from about 0.7 micrometers to about 0.1 micrometers.

Next, the mesa etching part 12 is embedded by polyimide 11, and the bonding pad 17 is formed on it. Next, a part of the insulating film 8 where the wiring part 18 is to be formed and a part of the insulating film 8 on the p-type semiconductor multilayer film reflector 6 which is to be a light emitting opening are removed and the p-side electrode 9 is formed on the p-type GaAs contact layer 7. The wiring 18 which connects the bonding pad 17 and the p-side electrode 9 is formed simultaneously, and the n-side electrode 10 is formed on the back of the substrate.

Thus, in the produced VCSEL diode, the room temperature continuous wave oscillation with low threshold current density (1 kA/cm$^2$) was obtained according to the effect of compressive strain introduction into the active layer at the wavelength of 1.3 micrometers, and the characteristic in high temperature was also good. Moreover, the shape of the non-oxidized part made by the anisotropy oxidization and the laser beam pattern has been improved, and the desired beam pattern shape was acquired. Consequently, stabilization of the transverse mode was able to be attained. Moreover, over the whole part within a wafer, reproducibility was excellent. The laser characteristics, such as a single mode operation, low threshold current and voltage, and a high output power were equalized. Thus, the mass-production nature of a highly efficient VCSEL diode device was improved. It turned out that the invention is effective at aiming the improvement of the controllability, reproducibility, and uniformity of the size, especially when the diameter of the laser beam which the current confinement portion 14 surrounds was less than 10 micrometers at which the rate of change of the size to a desired value becomes large.

FIG. 10A through FIG. 10C are schematic diagrams showing the VCSEL diode of the modification of this embodiment. That is, these figures correspond to FIGS. 1A through 1C, respectively.

In the case of the structure expressed in FIG. 1B, the diameter of an opening of an upper electrode 9 is the same or larger than that of the current confinement portion 14, and the tip of an upper electrode 9 is provided on the proton implantation part 15.

In contrast, in this modification, the diameter of the opening of the upper electrode 9 is smaller than the diameter of the current confinement portion 14, and the tip of the upper electrode 9 is extending to the light emitting part inside the proton implantation part 15. Since the implanted proton concentration is not so high that is may change the contact resistance and the path of the current confinement path, the similar effect of the invention as the element of the structure of FIGS. 1A through 1C is acquired.

Second Embodiment

Next, the second embodiment of the invention will be explained.

Figure 11A:
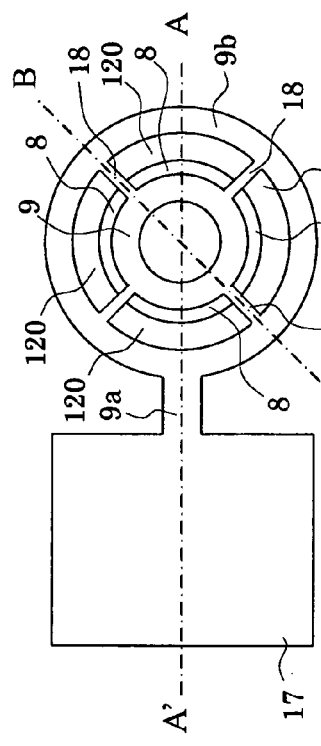
FIG. 11A through FIG. 11C are schematic diagrams of the VCSEL diode according to the second embodiment of the invention, where
Figure 11B:
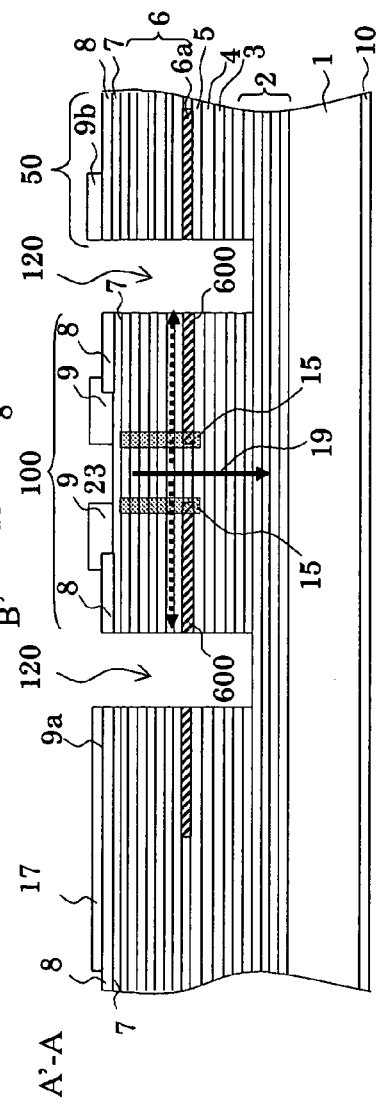
Figure 11C:
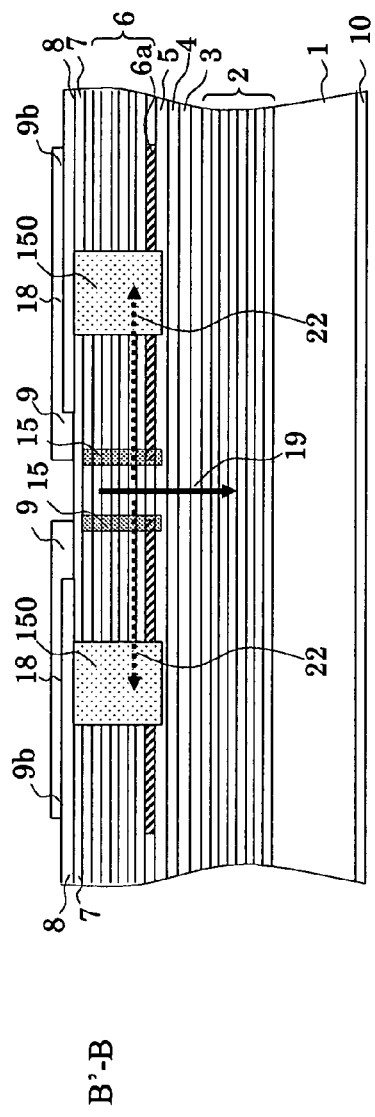

FIG. 11A through FIG. 11C are schematic diagrams of the VCSEL diode according to the second embodiment of the invention. FIG. 11A is a plan view, FIG. 11B is the A'–A line sectional view of FIG. 11A, and FIG. 11C is the B'–B line sectional view of FIG. 11A. The same symbols are given to the same elements as what were mentioned above with reference to FIG. 1A through FIG. 10C about this figures, and detailed explanation will be omitted.

The recesses 120 are provided around the mesa 100 containing the first semiconductor multilayer film reflector 6 and the semiconductor active layer 4 in this embodiment. The circumference part 50 is formed separated from the mesa 100 by these recesses 120. Moreover, the circumference part 50 also has the same laminated structure as the mesa 100, and the surface of this circumference part 50 is as high as the surface of the mesa 100.

The circumference electrode 9b is formed on the circumference part 50. And the contact electrode 9 and the circumference electrode 9b are connected by the wiring part 18. Moreover, the circumference electrode 9b and the bonding pad 17 are connected by the wiring part 9a.

On the other hand, the surface protection film 8 which consists of silicon nitride film is provided on the contact layer 7.

Such a surface emitting semiconductor laser is made to emit the light by injecting current into the light emitting part 13 through the first semiconductor multilayer film reflector 6 from the contact electrode 9, as shown by arrow 19.

In this VCSEL diode, the wiring part 9a which connects the contact electrode 9 and the bonding pad 17 is mostly formed on the same level, and has a structure which does not need planarizing processing. Therefore, this VCSEL has the advantage that the step coverage of the wiring can be improved.

Moreover, a current component with the current path shown by the arrow 22 can be intercepted by providing the high resistance part 150 formed by the proton implantation under the wiring part 18 which connects the contact electrode 9 and the circumference electrode 9b as shown in FIG. 11C. Therefore, in this VCSEL diode, the current can be passed through only the current path which is shown by the arrow 19, and the current confinement can be carried out very efficiently. Consequently, it becomes possible to lower the threshold current and voltage value, make the response speed high, and improve a mass-productivity.

Moreover, in this VCSEL, the compression stress which generate with heat processes, such as a selective oxidation process, which is applied to the active layer or the central part of the mesa structure can be reduced by providing the film 8 which has a tensile stress. Furthermore, since the shape of the anisotropy oxidization of an oxidization part can be corrected by proton implantation into the oxidizee layer 6a, the crack and breakage in an interface are controlled and the tolerance over the heat process after the selective oxidation process also increases. Consequently, it becomes possible to improve the reliability of the devices and obtain a long life.

Moreover, the controllability, uniformity and reproducibility of the size and the controllability of the shape of the emitting beam pattern increase, and a variation between devices is suppressed with regard to the laser characteristics including a threshold current and voltage, an optical output power and transverse mode control. Thus, the VCSEL diode devices with high performance can be mass-produced.

Next, the manufacturing method of this VCSEL will be explained concretely.

First, a semiconductor laminated structure is grown on a GaAs substrate 1. The details can be made to be the same as that of what was mentioned above about the first embodiment.

Next, Si$_3$N$_4$ film is formed as an etching mask film 8 for a pattern formation. In this case, a film stress was controlled by adjusting the source gasses, the pressure and flux of $SiH_4$, $NH_3$, and $N_2$, and thus, the film which has tensile stress of 150 MPa is formed. The value of the tensile stress of the film 8 can be controlled in consideration of heat stress (thermal stress) $\sigma_T$ generated between the etching mask film 8 and the GaAs substrate 1 in a steam oxidization process.

For example, when wet oxidization process temperature is set as 420 degrees C., the compressive stress of $\sigma_T$=−158 MPa occurs between $Si_3N_4$ film ($E_F$=160 GPa and $\alpha_F$=2.7×$10^{-7}$/K) and GaAs ($\alpha_F$=6.0×$10^{-6}$/K) of the substrate. That is, the compressive stress is applied to the substrate 1. Then, in order to reduce this compressive stress, the film 8 which has tensile stress is formed, the compression stress applied to the active layer 4 is eased, and the heat resistance is raised. Furthermore, the compressive stress to the active layer 4 and central part of the mesa structure 100 which are applied by volume shrinkage caused by the oxidization of the oxidizee layer 6a which contains high aluminum content is eased by forming the etching mask film 8 which has a tensile stress. Moreover, improvement in the reliability of devices can be improved and a long life of elements can be attained because the crack and breakage at the interface are suppressed and tolerance increases to the heat process after the selective oxidization process.

When using $SiO_2$ thin film ($E_F$=74 GPa and $\alpha_F$=0.4×$10^{-6}$/K) which is the material of the etching mask film used in the conventional example on the other hand, in addition to the compressive stress of heat stress $\sigma_T$=−124 MPa generated between the etching mask film 8 and the GaAs substrate 1, in a wet oxidization process, it is easy to become the film having a compressive stress of about −200 MPa at the time of film forming. Therefore, the compressive stress applied to the active layer during and after the wet oxidization process will increase further, and the tolerance to a heat will become small.

Next, the proton implantation part 15 is formed. Here, the $Si_3N_4$ film 8 and a resist are used for an implant mask, and the pattern 150 for isolation and the proton implantation part 15 for controlling the selective oxidation are formed.

Next, with ion implantation equipment, accelerating voltage 100, 200, 300 keV and 1×$10^{15}$/$cm^2$ of dose amount is irradiated to each of the pattern part 150 for isolation and implanting proton, a proton is poured into, the high resistance part 150 is formed. Then, proton are uniformly distributed over a part with a depth of 0.5–2.5 micrometers, and a part with a depth less than about 4 micrometers becomes the part with high resistance (in this example, the depth from the surface to the active layer is about 3 micrometers).

The ion implantation to the proton implantation part 15 to control the selective oxidation was performed under the conditions that accelerating voltage is 320 keV(s) and a dose amount is 5×$10^{13}$/$cm^2$, so that the proton concentration of the ion implantation part of the oxidizee layer 6a, AlAs layer (a depth of 2.6 micrometers from the surface) might be set to 1×$10^{18}$/$cm^3$. On the proton implant conditions of the proton implantation part 15 for selective oxidation control, the resistance of the implantation part does not become high. However, the oxidization rate falls to less than ⅓, as the dependence of the oxidization rate of the Al(Ga)As layer on the proton concentration shown in FIG. 4A.

Therefore, the oxidization rate of the selective oxidation layer 6a can be controlled, and the series resistance does not also become high. Moreover, the proton implantation part pattern may be set up appropriately in order to control the anisotropy oxidization.

Next, the etching mask film 8 at the p-side electrode 9 and at the light emitting opening 23 is removed, and the p-side electrode 9 is formed on the p-type GaAs contact layer, and the wiring part 9a, the circumference electrode 9b, the wiring part 18, and the bonding pad 17 is formed on the protective film 8.

Next, the mesa pattern is formed in the etching mask film 8 with the same photolithography process, the upper part of the n-type semiconductor multilayer film reflector 2 is etched, and thus, the recess 120 and the mesa 100 surrounded by the recess 120 are formed. The mesa patterning can be performed by the etching processing using mixed gas including $BCl_3$ and nitrogen with the ICP (Inductively Coupled Plasma) plasma dry etching equipment as mentioned above.

Here, the conditions are set to perform the anisotropic etching by adjusting an antenna output, a bias output, and substrate temperature. In order to produce the VCSEL diode having a circular current confinement portion 14 of 5 micrometers in diameter, etching is performed to form the mesa 100 having a shape of a pillar of 45 micrometers in diameter.

Next, 400 degrees centigrade through 450 degrees centigrade heat treatment is performed in a steam atmosphere, and the oxidization part 600 is formed by carrying out the selective oxidation of the oxidizee layer 6a from the exposed part of the mesa side in a lateral direction. Then, the oxidization length from the side can be set to 20 micrometers and the current confinement portion (non-oxidizing part) 14 of a diameter of 5 micrometer can be formed. According to this example, about 40% of improvement was realized compared with the conventional system in 3-σ value of the variation of the size within the field of the current confinement portion 14 (inside of a 3-inch wafer), by providing the proton implantation part 16.

Moreover, although the strain of the shape by anisotropy oxidization had produced the size difference of 0.75 micrometers in the lengthwise direction and the lateral direction conventionally, which was reduced to 0.1 micrometers in this example. Moreover, since the oxidization part 600 with high symmetric property is formed in this example, the compressive stress applied to the central part of the active layer and the mesa structure by volume shrinkage of the oxidizee layer 6a will be applied more isotropically.

Next, the n-side electrode 10 is formed in the substrate, and thus, the principal part of laser will be completed.

Thus, by forming the high resistance part 150 by proton implantation under a wiring path, the leak current 22 was prevented. In addition, owing to the effect of compressive strain introduction of an active layer 4, the room temperature continuous wave oscillation in low threshold current density and the single mode was obtained, and the characteristic in high temperature of the produced VCSEL diode was also good.

Moreover, since the contact electrode 9, the wiring part 18, circumference electrode 9b, wiring part 9a, and a bonding pad 17 are mostly formed on the same level, the structure in this embodiment has the advantage that the VCSEL diode which does not have steps on its surface and is excellent in mass-production can be offered.

Moreover, the size and shape of the current confinement portion 14 and the emitting beam pattern are improved by suppressing the effect of the anisotropy oxidization as mentioned above about the first embodiment, and thus, a desired size and shape of the beam pattern are acquired. Furthermore, since the highly symmetric oxidization part is formed, the compressive stress applied to the center of the active layer and the mesa structure in the selective oxidation process becomes isotropic. Moreover, compressive stress can be reduced in an isotropic fashion by forming the film 8 which has a tensile stress. Therefore, the crack and breakage in an interface are controlled, the tolerance over the heat process after the selective oxidation process also increases, and improvement in the reliability of devices is improved and a long life of devices is attained. The effect of the invention is especially large to the VCSEL diode in which quantum well layers of $Ga_xIn_{1-x}As_yN_{1-y}$ ($0 \leq x \leq 1$, $0 \leq y < 1$) having a larger strain is used in the active layer.

Moreover, the controllability, uniformity and reproducibility of the size and the shape of the emitting beam pattern are improved, the variation between devices is suppressed as for the laser characteristic including a threshold current and voltage, an optical output power and transverse mode control, and thus, the VCSEL diode device with high performance could be mass-produced. Especially, when setting the diameter of the beam to less than 10 micrometers, although the rate of change of the size to a desired value becomes large, the controllability, reproducibility and uniformity of the size and shape can be improved, according to this embodiment.

Figure 12A:
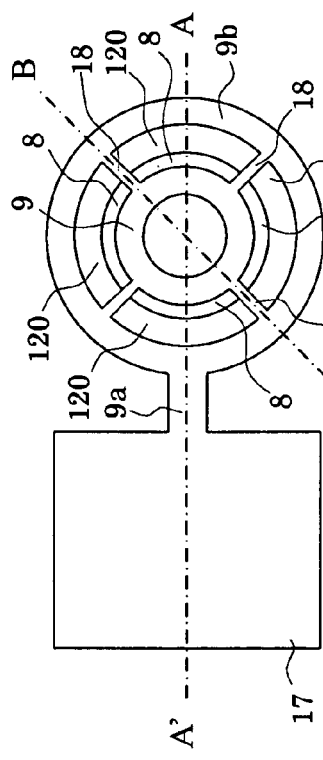
FIG. 12A through FIG. 12C are schematic diagrams showing the VCSEL diode of the modification of this embodiment, where
Figure 12B:
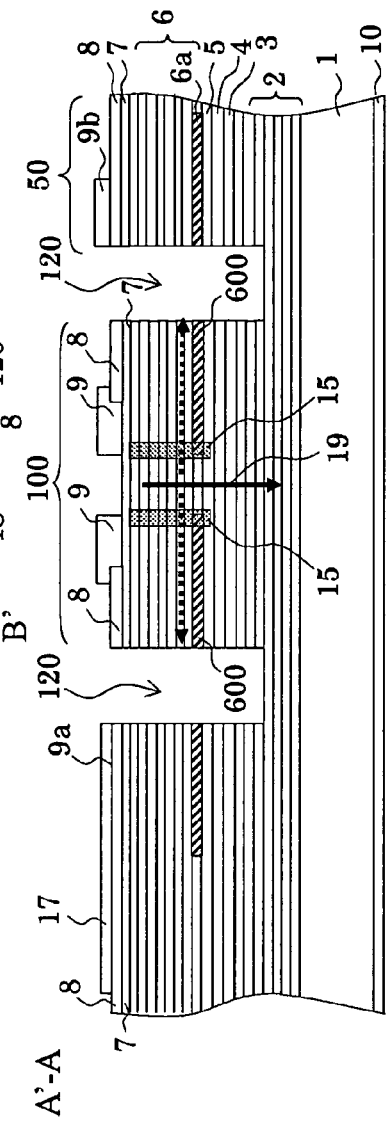
Figure 12C:
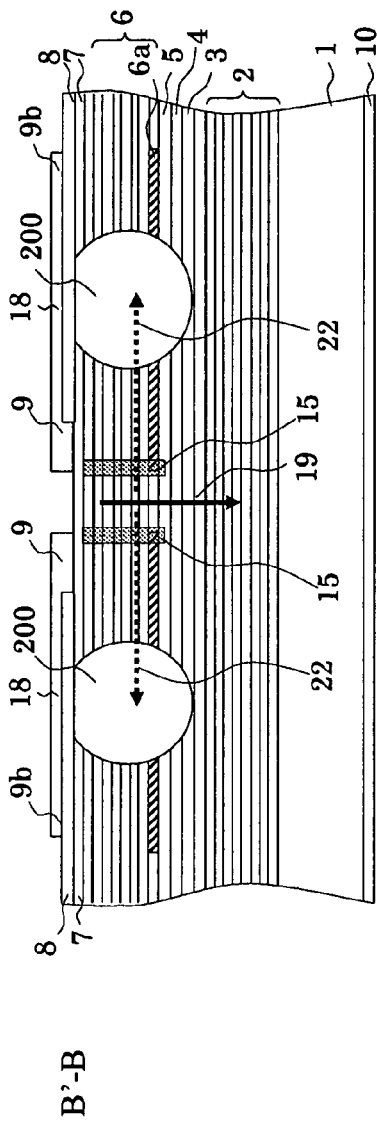

FIG. 12A through FIG. 12C are schematic diagrams showing the VCSEL diode of the modification of this embodiment. That is, FIG. 12A is a plan view, FIG. 12B is the sectional view of A'–A line of FIG. 12A, and FIG. 12C is the sectional view of B'–B line of FIG. 12A. The same symbols are given to the same elements as what were mentioned above with reference to FIG. 1 through FIG. 11 about these figures, and detailed explanation will be omitted.

In this modification, a cave 200 is provided under the wiring part 18. In the case of the laser shown in FIG. 11, the high resistance part 150 is provided under the wiring part 18 of the p-side electrode by proton implantation in order to prevent the leak current 22 out of the mesa part. In contrast, in this modification, the cave 200 is provided. Also in this way, the leak current 22 of a lateral direction can be prevented.

In this case, after the wet oxidation process, the resist pattern for isolation can be formed, the GaAs contact layer 7 and the upper semiconductor multilayer film reflector 6 under the wiring part 18 of the p-side electrode can be removed by etching with SH (mixed-solution of sulfuric acid and hydrogen peroxide water) solution processing, and the cave 200 can be formed. The leak current 22 to the outside of the pseudo-mesa part 100 can be intercepted completely by forming the cave 200 under the wiring part 18.

Heretofore, the embodiments of the present invention have been explained, referring to FIG. 1A through FIG. 12C. However, the present invention is not limited to these specific examples.

For example, in the above-mentioned examples, although the case where the $Ga_xIn_{1-x}As_yN_{1-y}$ ($0 \leq x \leq 1$, $0 \leq y < 1$) is used for the active layer 4 is explained, various materials including an InGaAlP system, an AlGaAs system, and an InGaAsP system can also be used.

Various materials can also be used for the cladding layers 3 and 5, and the semiconductor multilayer film reflectors 2 and 6. For example, as the semiconductor multilayer film reflectors 2 and 6, it is not limited to the laminated structure of the AlGaAs layers and the GaAs layers, but it can also be the laminated structure of materials with the high refractive index and materials with the low refractive index which do not contain Al. Moreover, the combination, such as GaInP/GaAs, GaInPAs/GaAs, GaInP/GaInAs, GaInP/GaPAs, GaInP/GaInAs, or GaP/GaInNAs can be used.

Moreover, the MBE (molecular beam epitaxy) method can also be used for growing the semiconductor layer. Moreover, in the above-mentioned example, although the cases where the triple quantum well structure was used were shown, structures using other quantum wells etc. can also be used.

Moreover, although the case where the oxidizee layer 6a was one layer was explained, the same effect can be obtained also when a plurality of layers are provided.

Moreover, as a plane shape of the current confinement portion 14, although the shape of a square was mainly mentioned in this example, it is clear that a size and shape control can be performed also in the shape of a circle, a rectangle and an ellipse.

Moreover, although the case where the pattern of 1-2-micrometer width was formed was mentioned by the above-mentioned example as a pattern of the proton implantation part, it is clear that the same effect is acquired even if the pattern width is changed corresponding to desired size and proton concentration. Moreover, a big effect is acquired by making the shape of the pattern of the proton implantation part suitable for considering desired shape and a desired use. Moreover, it is also clear that a big effect is acquired by adjusting the accelerating voltage and the dose amount in ion implantation to control the depth and the proton concentration of the proton implantation part from the surface according to the position and structure of the oxidizee layer 6a.

Moreover, although the proton concentration implanted into an oxidized part was also explained to be in a range from $1 \times 10^{17}/cm^3$ to $1 \times 10^{18}/cm^3$, the same effect is acquired even if the proton with higher concentration or lower concentration rather than this example are used. If proton with higher concentration is implanted in, the oxidization rate of the oxidizee layer 6a will fall greatly, and the advance of oxidization can be controlled in a desired position. Therefore the size and the shape of the current confinement portion 14 can be controlled more precisely.

If the diameter of an opening of an upper electrode 9 is smaller than the path of the current confinement portion 14 and is made to be inside the proton implantation part 15 as shown in FIG. 10A through 10C, a high-concentration proton can be implanted more than $1 \times 10^{18}/cm^3$.

Moreover, although the AlAs layer is used as the oxidizee layer 6a in the above-mentioned example, even if $Al_xGa_{1-x}As$ ($x > 0.95$) with high aluminum composition ratio is used, oxidization rate falls by the same extent corresponding to proton concentration in the wet oxidization process, and the same effect as the invention is acquired.

In addition, all of the VCSEL's may be appropriately changed by those skilled in the art with the known techniques to carry out the invention as taught in the specification and obtain equivalent effects.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A vertical-cavity surface emitting laser diode comprising a current confinement portion having a mesa including an oxidizee layer, the oxidizee layer having an oxidized part and a non-oxidized part, the oxidized part being formed by oxidizing the oxidizee layer from a side wall of the mesa, an electric current being injected on the non-oxidized part, the oxidizee layer having a proton-containing part including protons at an interface between the oxidized part and the non-oxidized part and without protons at an area adjacent to the side wall of the mesa.

2. The vertical-cavity surface emitting laser diode according to claim 1, wherein the proton-containing part is provided selectively near a boundary between the oxidized part and the non-oxidized part, and is not provided near a center of the non-oxidized part.

3. The vertical-cavity surface emitting laser diode according to claim 1, wherein a concentration of protons in the proton-containing part is equal to or less than $1 \times 10^{18}/cm^3$.

4. The vertical-cavity surface emitting laser diode according to claim 1, further comprising:
an active layer; and
a film configured to provide a tensile stress to the active layer in a direction along a surface of the film.

5. A vertical-cavity surface emitting laser diode comprising a current confinement portion having a mesa including an oxidizee layer, the oxidizee layer having an oxidized part and a non-oxidized part, the oxidized part being formed by oxidizing the oxidizee layer from a side wall of the mesa, and an electric current being injected into the non-oxidized part, wherein
a portion of the oxidizee layer, including an interface between the oxidized part and the non-oxidized part, includes protons, and without protons at an area adjacent to the side wall of the mesa.

6. The vertical-cavity surface emitting laser diode according to claim 5, wherein a concentration of protons in the non-oxidized part is equal to or less than $1 \times 10^{18}/cm^3$.

7. The vertical-cavity surface emitting laser diode according to claim 5, further comprising:
an active layer; and
a film configured to provide a tensile stress to the active layer in a direction along a major surface of the film.

8. A vertical-cavity surface emitting laser diode comprising:
a first and a second reflectors;
an active layer provided between the first and the second reflectors; and
an oxidizee layer having a non-oxidized part and an oxidized part provided around the non-oxidized part,
an electric current being injected into the non-oxidized part, and
the oxidizee layer having a proton-containing part including protons substantially at an interface between the oxidized part and the non-oxidized part, and without protons at an area adjacent to a side wall of the oxidizee layer.

9. The vertical-cavity surface emitting laser diode according to claim 8, wherein the proton-containing part is provided selectively near a boundary between the oxidized part and the non-oxidized part, and is not provided near a center of the non-oxidized part.

10. The vertical-cavity surface emitting laser diode according to claim 8, wherein the proton-containing part is provided all over the non-oxidized part.

11. The vertical-cavity surface emitting laser diode according to claim 8, wherein a concentration of protons in the proton-containing part is equal to or less than $1 \times 10^{18}/cm^3$.

12. The vertical-cavity surface emitting laser diode according to claim 8, further comprising a film configured to provide a tensile stress to the active layer in a direction along a major surface of the film.

13. A vertical-cavity surface emitting laser diode comprising:
a substrate;
an active layer provided on the substrate and having a emitting part;
a first and a second reflectors sandwiching the active layer therebetween and forming a laser cavity vertical to the substrate;
a pair of electrodes configured to inject an electric current into the active layer; and
an oxidizee layer provided above or below the active layer;
a mesa formed to include the oxidizee layer, and
the oxidizee layer having an oxidized part of a high resistance extending from a side wall of the mesa to a proximity of the emitting part, a non-oxidized part of a low resistance. surrounded by the oxidized part, and a proton-containing part including protons an interface between the oxidized part and the non-oxidized part and without protons at an area adjacent to the side wall of the mesa.

14. The vertical-cavity surface emitting laser diode according to claim 13, wherein;
the proton-containing part is provided selectively near a boundary between the oxidized part and the non-oxidized part, and is not provided near a center of the non-oxidized part,
one of the electrodes which is provided above the active layer has an opening to release a light emitted from the active layer, and
the opening is larger than an portion of the non-oxidized part which is thinner than the proton-containing part.

15. The vertical-cavity surface emitting laser diode according to claim 13, wherein the proton-containing part is provided selectively near a boundary between the oxidized part and the non-oxidized part, and is not provided near a center of the non-oxidized part.

16. The vertical-cavity surface emitting laser diode according to claim 13, wherein the proton-containing part is provided all over the non-oxidized part.

17. The vertical-cavity surface emitting laser diode according to claim 13, wherein a concentration of protons in the proton-containing part is equal to or less than $1 \times 10^{18}/cm^3$.

18. The vertical-cavity surface emitting laser diode according to claim 13, further comprising a film configured to provide a tensile stress to the active layer in a direction along a surface of the film.

19. A method of manufacturing a vertical-cavity surface emitting laser diode having a mesa which includes a current confinement portion having an oxidizee layer, the oxidizee layer having an oxidized part and a non-oxidized part, the oxidized part being formed by oxidizing a part of the oxidizee layer, an electric current being concentrated on the non-oxidized part, comprising:
forming a proton-containing part in the oxidizee layer by selectively implanting proton into the oxidizee layer, the proton-containing part not being located at a an area adjacent to a side face of the mesa; and
forming the oxidized part by oxidizing the oxidizee layer from the side face to the proton-containing part.

20. The method of manufacturing a vertical-cavity surface emitting laser diode according to claim 19, wherein a concentration of protons in the proton-containing part is equal to or less than $1 \times 10^{18}/cm^3$.

* * * * *